United States Patent
Xu et al.

(10) Patent No.: US 11,961,801 B2
(45) Date of Patent: Apr. 16, 2024

(54) INTEGRATED CIRCUITRY, MEMORY CIRCUITRY COMPRISING STRINGS OF MEMORY CELLS, AND METHOD OF FORMING INTEGRATED CIRCUITRY

(71) Applicant: Micron Technology, Inc., Boise, ID (US)

(72) Inventors: Lifang Xu, Boise, ID (US); Indra V. Chary, Boise, ID (US); David H. Wells, Boise, ID (US); Harsh Narendrakumar Jain, Boise, ID (US); Umberto Maria Meotto, Rivoli (IT); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 17/373,121

(22) Filed: Jul. 12, 2021

(65) Prior Publication Data
US 2023/0009880 A1 Jan. 12, 2023

(51) Int. Cl.
| H01L 23/528 | (2006.01) |
| H01L 21/768 | (2006.01) |
| H01L 23/522 | (2006.01) |
| H10B 41/27 | (2023.01) |
| H10B 41/41 | (2023.01) |
| H10B 43/27 | (2023.01) |
| H10B 43/40 | (2023.01) |

(52) U.S. Cl.
CPC .... *H01L 23/5283* (2013.01); *H01L 21/76816* (2013.01); *H01L 21/76877* (2013.01); *H01L 23/5226* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| 2019/0081061 A1* | 3/2019 | Tessariol ............ H01L 23/5226 |
| 2019/0371728 A1 | 12/2019 | Gossman et al. |
| 2020/0127001 A1 | 4/2020 | Hua et al. |

(Continued)

FOREIGN PATENT DOCUMENTS

CN 111758162 10/2020
WO PCT/US2022/030489 9/2022

*Primary Examiner* — Hsien Ming Lee
(74) *Attorney, Agent, or Firm* — Wells St. John P.S.

(57) ABSTRACT

Integrated circuitry comprises two three-dimensional (3D) array regions individually comprising tiers of electronic components. A stair-step region is between the two 3D-array regions. First stair-step structures alternate with second stair-step structures along a first direction within the stair-step region. The first stair-step structures individually comprise two opposing first flights of stairs in a first vertical cross-section along the first direction. The stairs in the first flights each have multiple different-depth treads in a second vertical cross-section that is along a second direction that is orthogonal to the first direction. The second stair-step structures individually comprise two opposing second flights of stairs in the first vertical cross-section. The stairs in the second flights each have only a single one tread along the second direction. Other embodiments, including method, are disclosed.

31 Claims, 14 Drawing Sheets

(56) References Cited

U.S. PATENT DOCUMENTS

| | | |
|---|---|---|
| 2020/0144292 A1 | 5/2020 | Lee |
| 2020/0251491 A1 | 8/2020 | Ozawa |
| 2020/0294850 A1 | 9/2020 | Lee |
| 2020/0303392 A1 | 9/2020 | Hua et al. |
| 2021/0358945 A1 | 11/2021 | Zhang et al. |

* cited by examiner

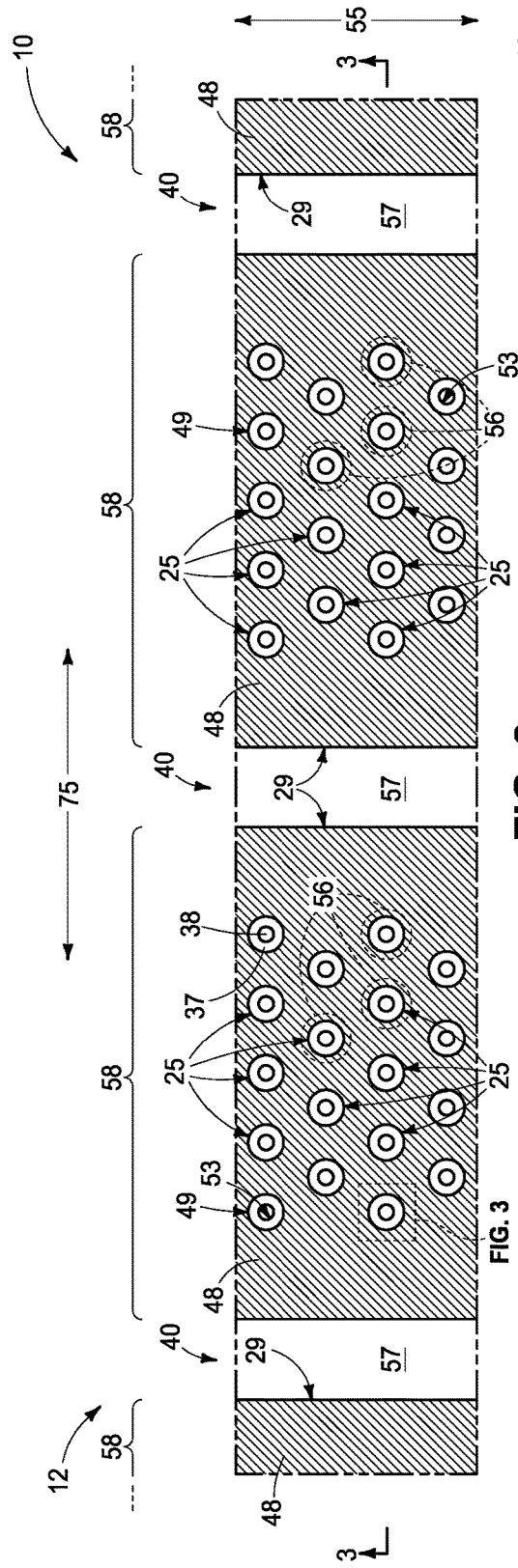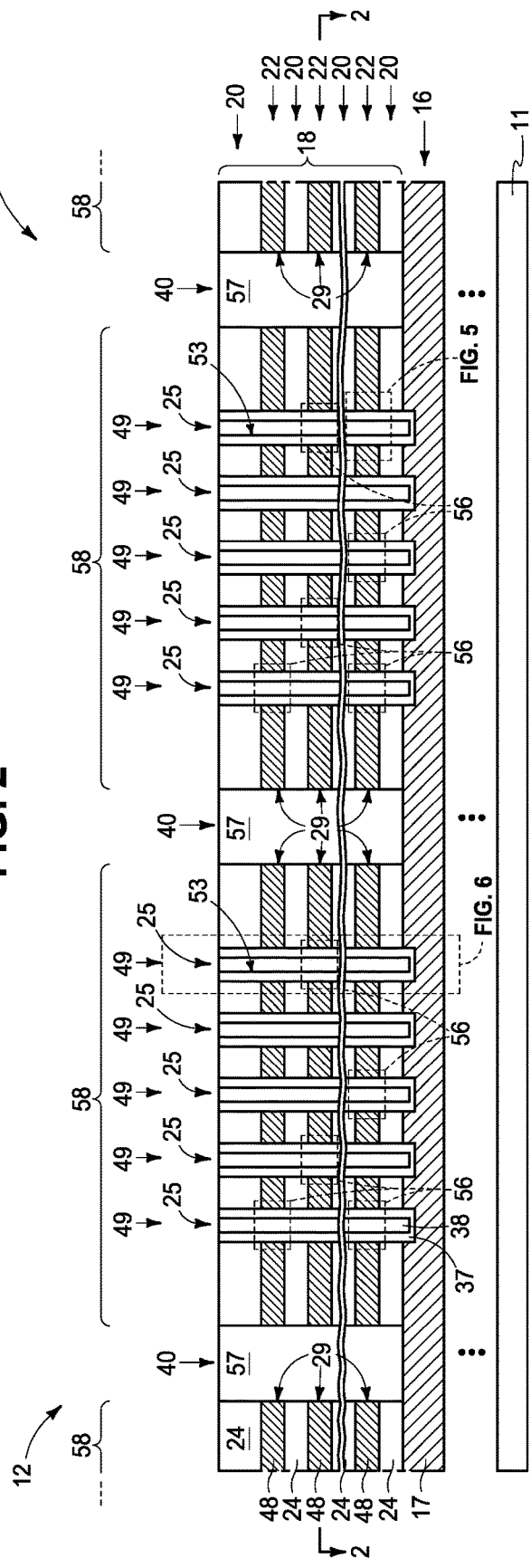

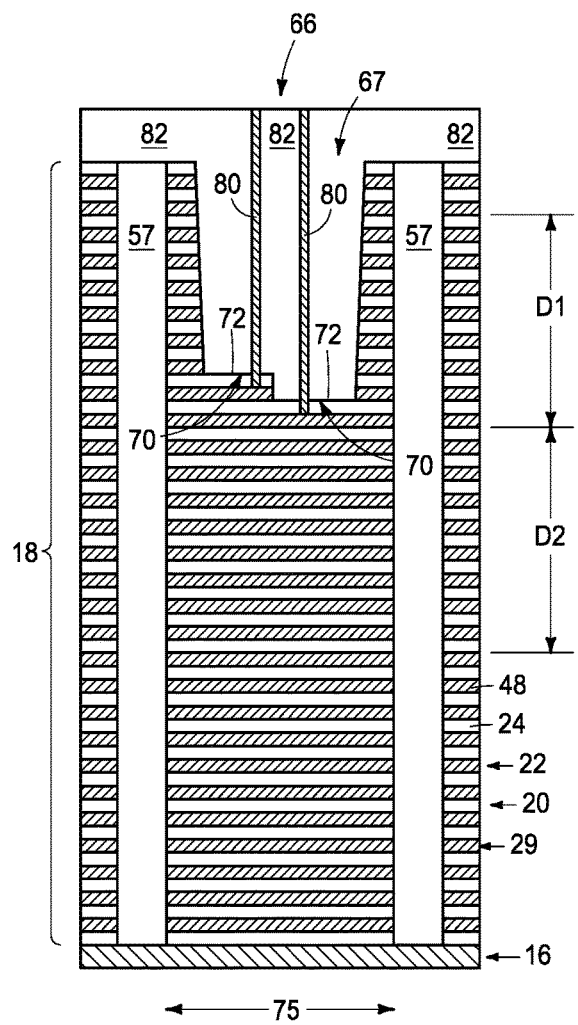
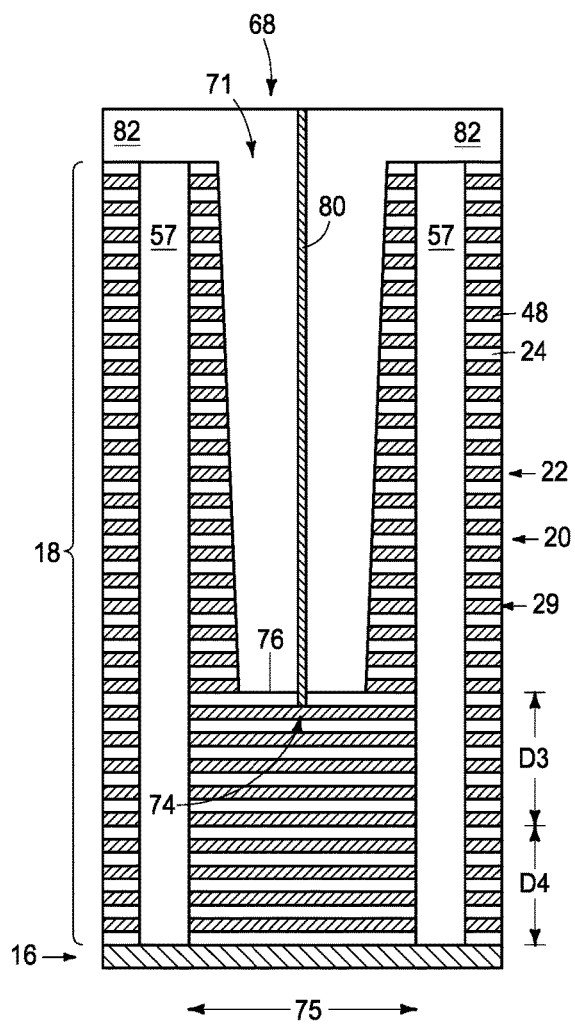
FIG. 8  FIG. 9

US 11,961,801 B2

INTEGRATED CIRCUITRY, MEMORY CIRCUITRY COMPRISING STRINGS OF MEMORY CELLS, AND METHOD OF FORMING INTEGRATED CIRCUITRY

TECHNICAL FIELD

Embodiments disclosed herein pertain to integrated circuitry, to memory circuitry comprising strings of memory cells, and to methods of forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 2 is a diagrammatic cross-sectional view taken through line 2-2 in FIG. 1.

FIG. 2 is a cross-sectional view of FIG. 3.
FIG. 3 is a cross-sectional view of FIG. 2.
FIG. 8 is a cross-sectional view of FIG. 10.
FIG. 9 is a cross-sectional view of FIG. 10.

DETAILED DESCRIPTION OF EXAMPLE EMBODIMENTS

Figure 1:
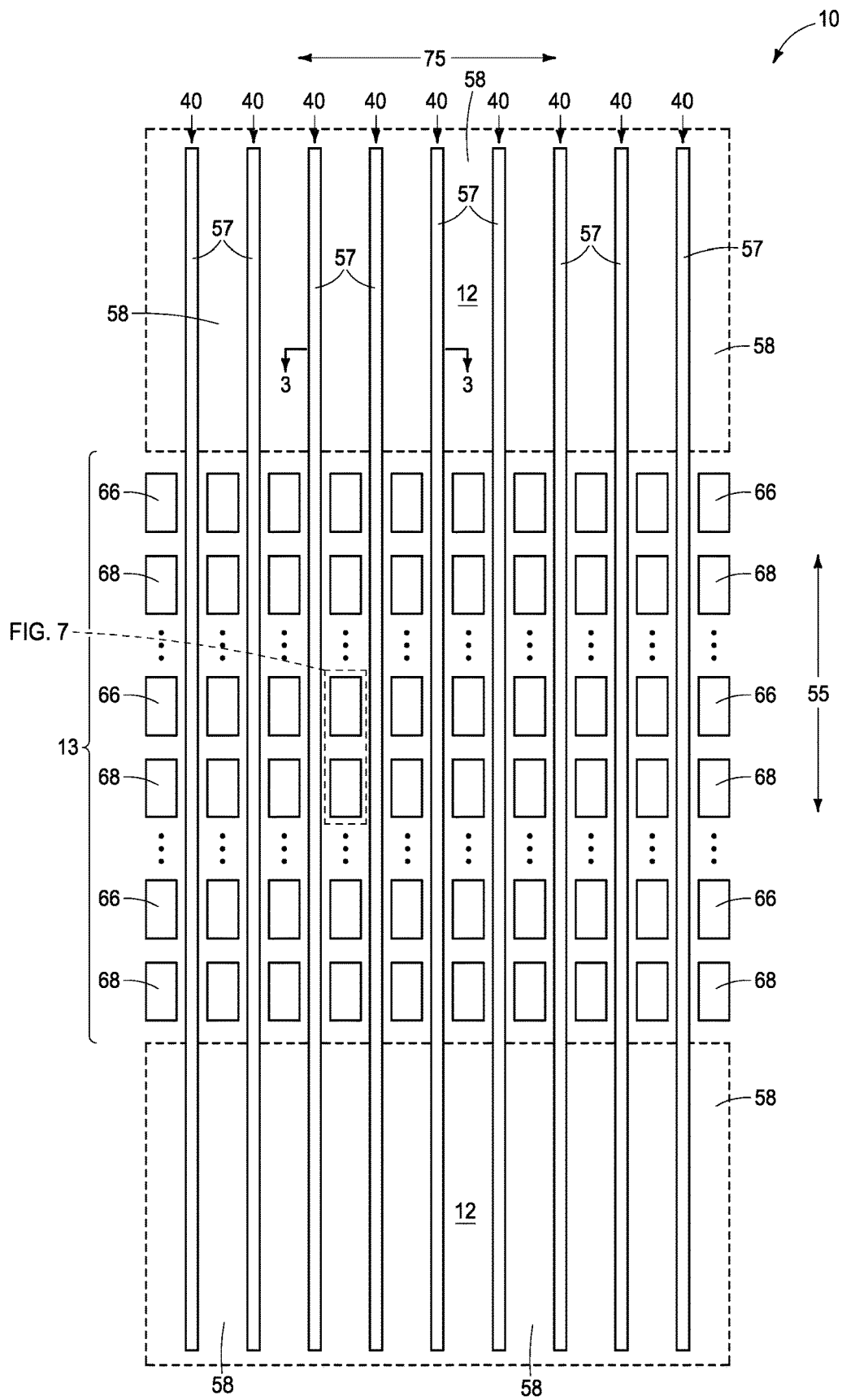
FIG. 1 is a diagrammatic view of a portion of memory circuitry comprising strings of memory cells in accordance with an embodiment of the invention.

FIGS. 1-11 show an example construction 10 having two memory-array regions 12 in which elevationally-extending strings 49 of transistors and/or memory cells 56 have been formed (e.g., comprising NAND). A stair-step region 13 is between memory-array regions 12 and comprises stair-step structures as described below. FIGS. 7-11 are of different and varying scales compared to FIGS. 1-6 for clarity in disclosure more pertinent to stair-step region 13 than to memory-array regions 12. Example construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-11—depicted materials. For example, other partially or wholly fabricated components of integrated circuitry may be provided somewhere above, about, or within base substrate 11. Control and/or other peripheral circuitry for operating components within an array (e.g., individual array regions 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 is above substrate 11. Conductor tier 16 may comprise part of control circuitry (e.g., peripheral-under-array circuitry and/or a common source line or plate) used to control read and write access to the transistors and/or memory cells that will be formed within array 12. A vertical stack 18 comprising vertically-alternating insulative tiers 20 and conductive tiers 22 is above conductor tier 16. In some embodiments, conductive tiers 22 are referred to as first tiers 22 and insulative tiers 20 are referred to as second tiers 20. Example thickness for each of tiers 20 and 22 is 22 to 60 nanometers. The example uppermost tier 20 may be thicker/thickest compared to one or more other tiers 20 and/or 22. Only a small number of tiers 20 and 22 is shown in FIGS. 1-11 (more shown in FIGS. 7-11 as compared to FIGS. 1-6 due to scale and for clarity in stair-step region 13), with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a first direction 55. Any alternate existing or future-developed arrangement and construction may be used.

The two memory-array regions 12 may be of the same or different constructions relative one another. Regardless, channel-material strings (e.g., 53) of memory cells (e.g., 56) extend through the insulative tiers (e.g., 20) and the conductive tiers (e.g., 22) in memory blocks (e.g., 58) in each of two memory-array regions 12. Further, insulative tiers 20 and conductive tiers 22 extend along first direction 55 from two memory-array regions 12 into stair-step region 13.

Example memory blocks 58 are shown as at least in part having been defined by horizontally-elongated trenches 40 that were formed (e.g., by anisotropic etching) into stack 18. Trenches 40 will typically be wider than lower channel openings 25 (e.g., 10 to 20 times wider, yet such wider degree not being shown in FIGS. 1 and 2 for brevity). Trenches 40 may have respective bottoms that are directly against conductor material 17 (e.g., atop or within) of conductor tier 16 (as shown) or may have respective bottoms that are above conductor material 17 of conductor tier 16 (not shown). Walls 57 are individually in trenches 40 between immediately-adjacent memory blocks 58. Walls 57 extending in first direction 55 from one of two memory-array regions 12 into the other of two memory-array regions 12 across stair-step region 13. Walls 57 may provide lateral electrical isolation (insulation) between immediately-laterally-adjacent memory blocks and between immediately-laterally-adjacent stair-step structures (described below). Walls 57 may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Walls 57 may include through array vias (TAVs, and not shown).

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Figure 6:
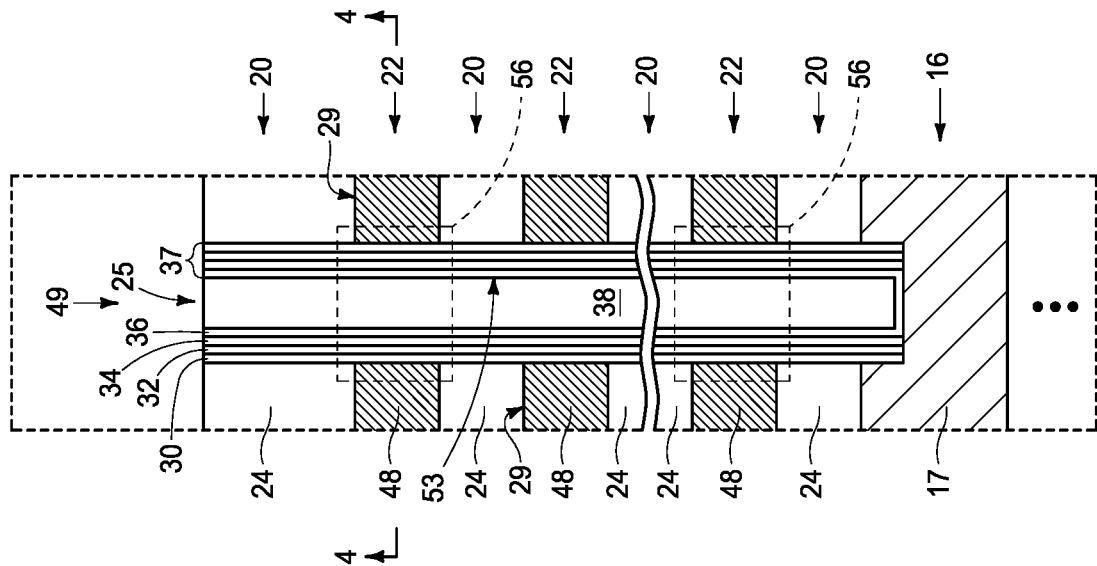
FIG. 6 is an enlargement of a portion of FIG. 3.
Figure 4:
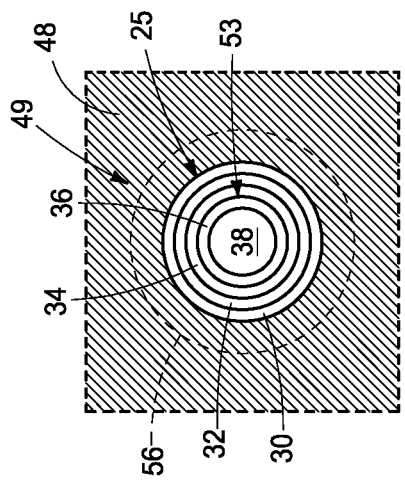
FIG. 4 is a cross-sectional view of FIG. 6.
Figure 5:
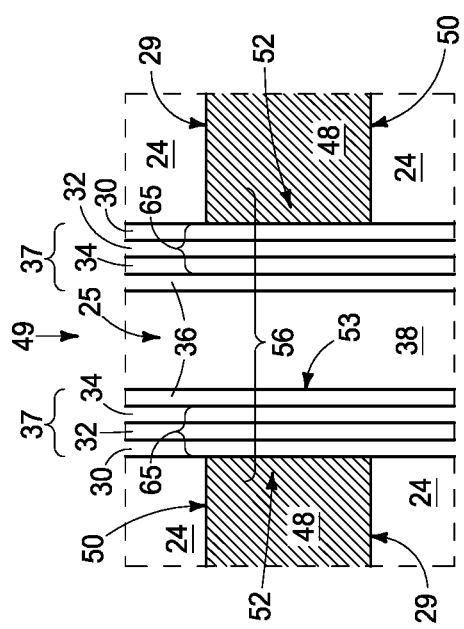
FIG. 5 is an enlargement of a portion of FIG. 6.

FIGS. 4-6 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Example conductive tiers 22 comprise conducting material 48 that is part of individual conductive lines 29 (e.g., wordlines) that extend across stair-step region 13 along first direction 55 into and within individual memory blocks 58 in each of two memory-array regions 12. Conductive lines 29 comprise part of elevationally-extending strings 49 of individual transistors and/or memory cells 56. A thin insulative liner (e.g., Al$_2$O$_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Within stair-step region 13 are first stair-step structures 66 that alternate with second stair-step structures 68 along first direction 55 laterally between immediately-adjacent walls 57. First stair-step structures 66 individually comprise two opposing first flights 67, 69 of stairs 70 in a first vertical cross-section (e.g., that of FIG. 7) along first direction 55. Stairs 70 of first flights 67, 69 each have multiple different-depth treads 72 (e.g., having a vertical riser between immediately-adjacent treads 72) in a second vertical cross-section (e.g., that of FIG. 8) that is along a second direction 75 that is orthogonal to first direction 55. In one embodiment and as shown, multiple different-depth treads 72 in individual second vertical cross-sections in individual first stair-step structures 66 are only two in number. Alternately, such may be more than two in number (not shown). Second stair-step structures 68 individually comprise two opposing second flights 71, 73 of stairs 74 in the first vertical cross-section, with stairs 74 in second flight 71, 73 each having only a single one tread 76 along second direction 75 (e.g., second flights 71, 73 being devoid of any stairs that individually comprise multiple different-depth treads in any and all second vertical cross-sections that is/are along the second direction). Flights 67, 69, 71, and 73 are each shown as having the same number of stairs (five) for ease of depiction. No flight need have the same number of stairs as another flight and more or fewer stairs may be in an individual flight. A crest 81 is between immediately-adjacent first stair-step structures 66 and second stair-step structures 68. Insulative material 82 is shown atop the first and second flights of stairs (e.g., combination of a silicon nitride liner directly against stairs 70 and 74, with silicon dioxide thereover).

In one embodiment, two opposing first flights 67, 69 of stairs 70 in individual first stair-step structures 66 extend along different non-overlapping depths D1, D2 relative one another (that may or may not be of the same lengths relative one another) and two opposing second flights 71, 73 of stairs 74 in individual second stair-step structures 68 extend along different non-overlapping depths D3, D4 relative one another (that may or may not be of the same lengths relative one another).

Figure 7:
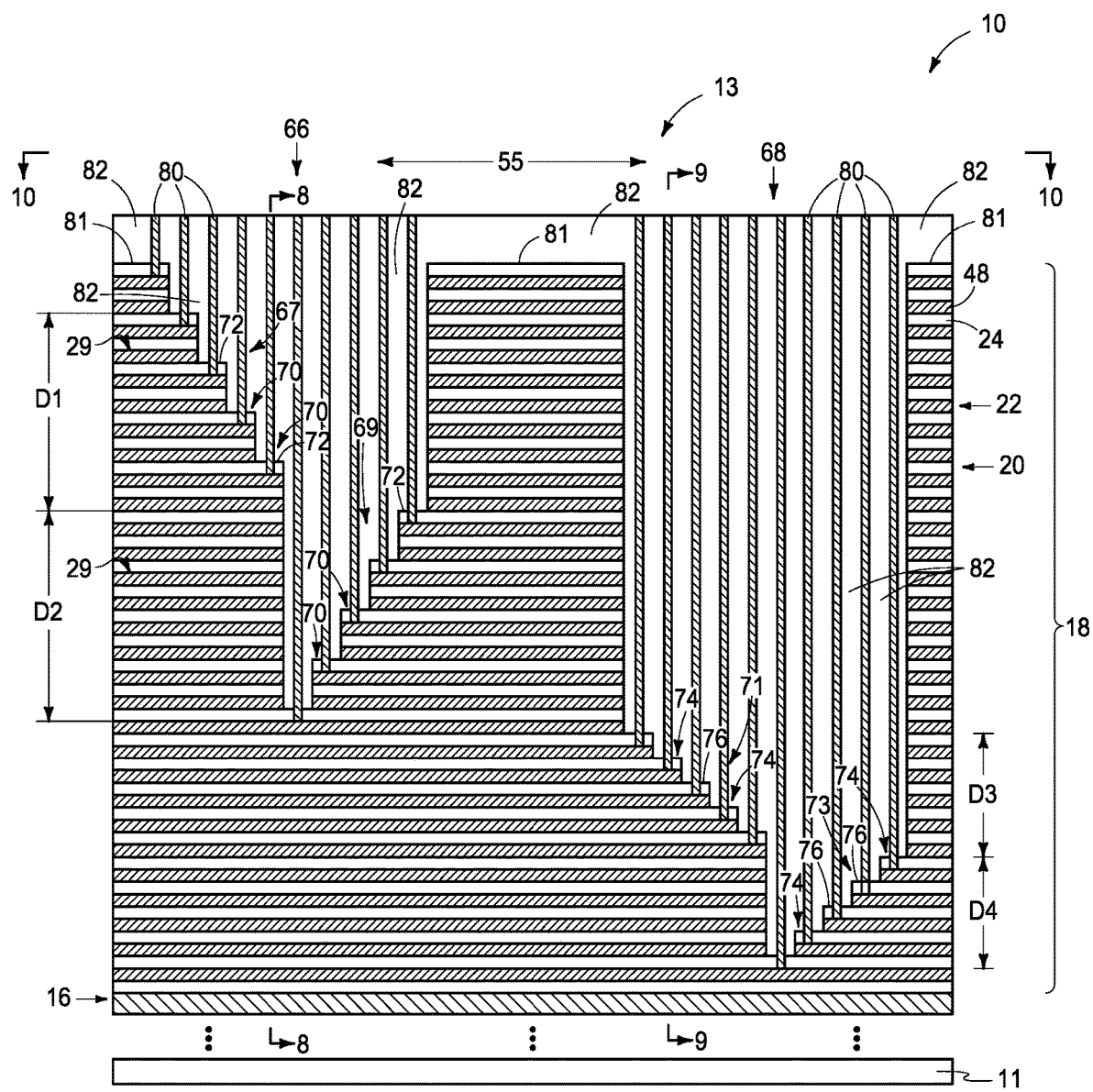
FIG. 7 is a cross-sectional view of FIG. 10.
Figure 10:
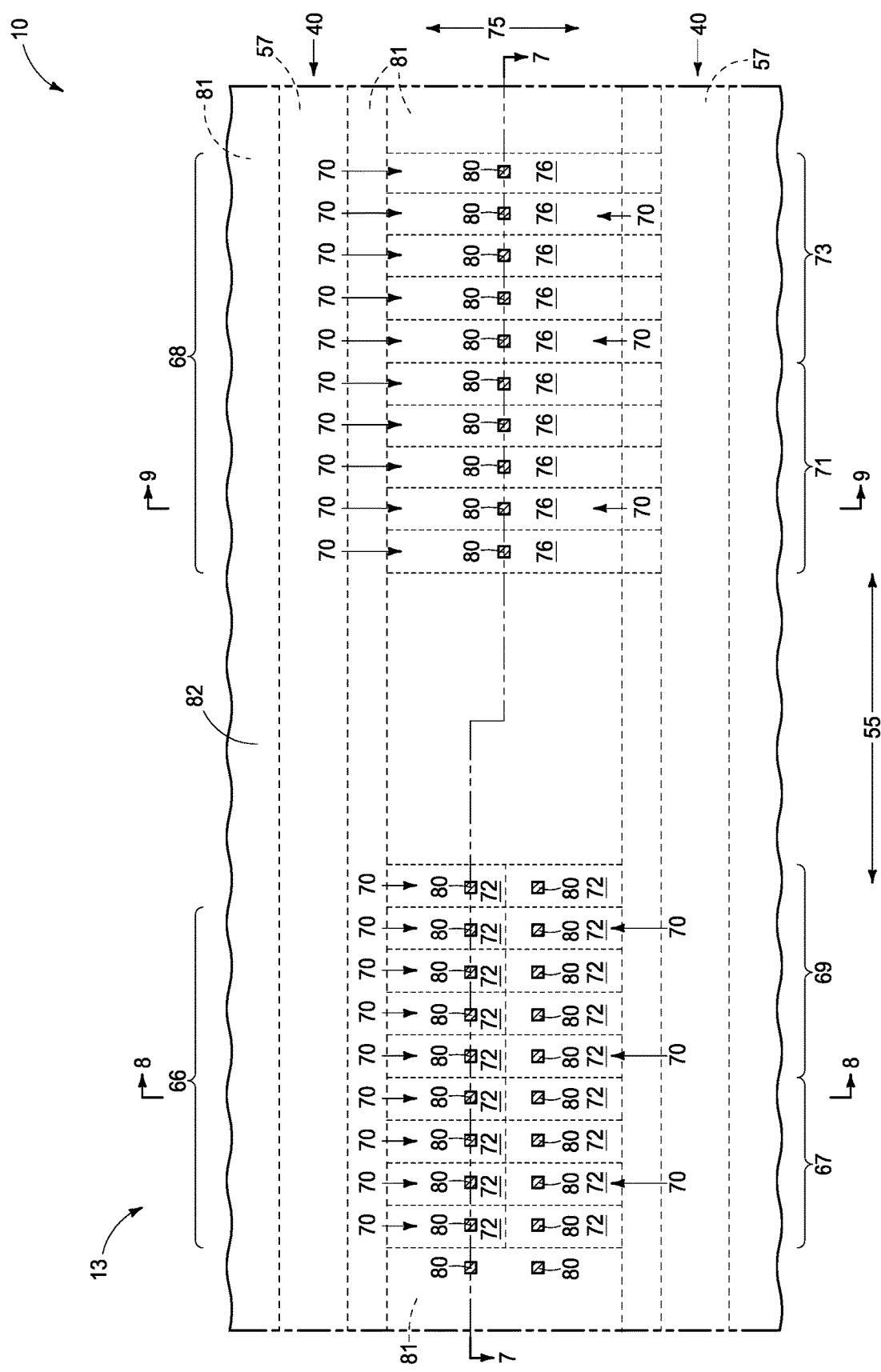
FIG. 10 is a top-down view of FIG. 7.
Figure 11:
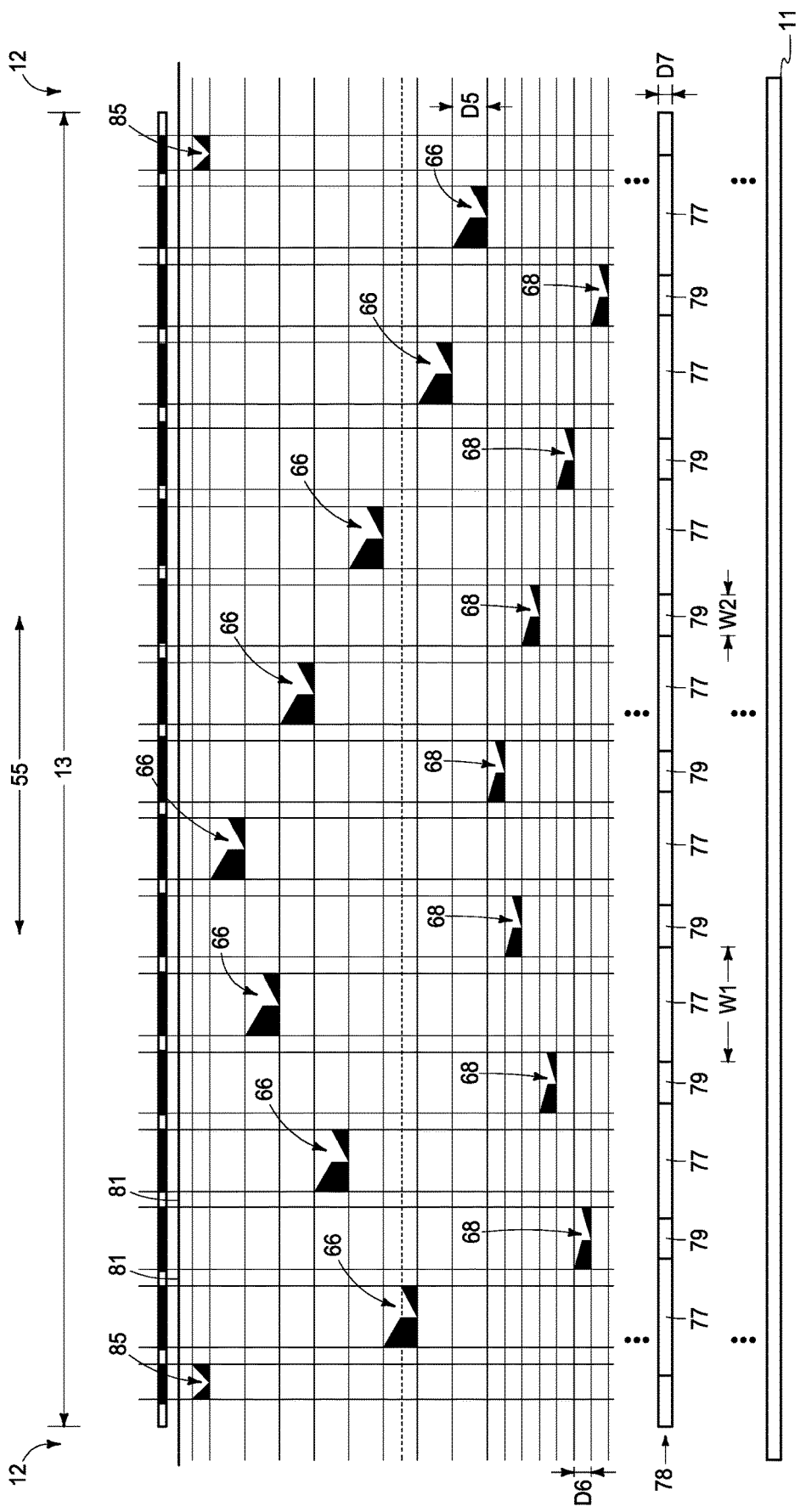
FIG. 11 is a diagrammatic view of a portion of memory circuitry in accordance with an embodiment of the invention.

Regardless, for ease of depiction, FIG. 7 shows the topmost stair 74 of second flight of stairs 71 in second stair-step structure 68 as starting in the immediately-next-lower tiers 20, 22 that are below lowest stair 70 in first flight 69 of stairs 70 in first stair-step structure 66. While such may occur, a more ideal vertical layout for alternating structures 66 and 68 is as shown in FIG. 11 where such does not occur. Further, regardless, and in one embodiment as shown in FIG. 11, all of first stair-step structures 66 extend along different non-overlapping depths D5 relative one another (that may be of the same or different vertical length[s] relative one another) and all of second stair-step structures 68 extend along different non-overlapping depths D6 relative one another (that may be of the same or different vertical length[s] relative one another), with at least a majority of all of second stair-step structures 68 being deeper than at least a majority of all of first stair-step structures 66. In one embodiment, at least one select gate drain stair-step structure 85 is in stair-step region 13, with all of second stair-step structures 68 being deeper than all of first stair-step structures 66 below the at least one select gate drain stair-step structure 85. (Structure 85 may incorporate structure attributes of structures 66 and/or 68). In one such embodiment, a deepest of all of the first stair-step structures 66 (e.g., that to the furthest right in FIG. 11) and a deepest of all of the second stair-step structures 68 (e.g., that to the furthest right in FIG. 11) are closest to one of two memory-array regions 12 with, in one embodiment as shown, such being closest to a same-one of the two memory-array regions (e.g., the right-illustrated memory-array region 12 as shown in FIG. 11). Regardless, and in one embodiment and as shown, each of first stair-step structures 66 and each of second stair-step structures 68 is everywhere laterally-spaced from its immediately-adjacent wall 57 (e.g., conductive lines 29 thereby extending across stair-step region 13 along first direction 55 into and within individual memory blocks 58 in each of two memory-array regions 12).

Conductive vias 80 extend through insulative material 82 to individually connect with a conductive line 29 of individual treads 72 and 76. Conductive vias 80 may be routed horizontally (not shown) above stack 18 and connect with individual TAVs (not shown) that extend through stack 18 to circuitry there-below. Such TAVs may extend through walls 57 and/or one or more stairs 70 and/or 74 and are not shown in the drawings for clarity as to what is shown and largely directed to aspects of the invention.

In one embodiment, the memory circuitry comprises first regions 77 of driver circuitry 78 (e.g., row drivers) directly under first stair-step structures 66 and second regions 79 of driver circuitry 78 directly under second stair-step structures 68, with first regions 77 individually being wider than individual second regions 79 in the first vertical cross-section (e.g., W1 versus W2 as shown). In one such embodiment, first regions 77 and second regions 79 extend along a same depth D7 relative one another. Regardless, and in one embodiment, first regions 77 extend in first direction 55 to also be directly under immediately-adjacent of second stair-step structures 68.

Any other attribute(s) or aspect(s) as shown and/or described herein with respect to other embodiments may be used in the embodiments shown and described with reference to the above embodiments.

Embodiments of the invention encompass integrated circuitry regardless of whether comprising memory circuitry and if comprising memory circuitry regardless of whether comprising strings of memory cells. Integrated circuitry in accordance with some embodiments of the invention comprises two three-dimensional (3D) array regions (e.g., 12) individually comprising tiers (e.g., 22) of electronic components (e.g., 56). A stair-step region (e.g., 13) is between the two 3D-array regions. First stair-step structures (e.g., 66) alternate with second stair-step structures (e.g., 68) along a first direction (e.g., 55) within the stair-step region. The first stair-step structures individually comprise two opposing first flights (e.g., 67, 69) of stairs (e.g., 70) in a first vertical cross-section (e.g., that of FIG. 7) along the first direction. The stairs in the first flights each have multiple different-depth treads (e.g., 72) in a second vertical cross-section (e.g., that of FIG. 8) that is along a second direction (e.g., 75) that is orthogonal to the first direction. The second stair-step structures individually comprise two opposing second flights (e.g., 71, 73) of stairs (e.g., 74) in the first vertical cross-section. The stairs in the second flights each have only a single one tread (e.g., 76) along the second direction. Any other attribute(s) or aspect(s) as shown and/or described herein with respect to other embodiments may be used.

Figure 12:
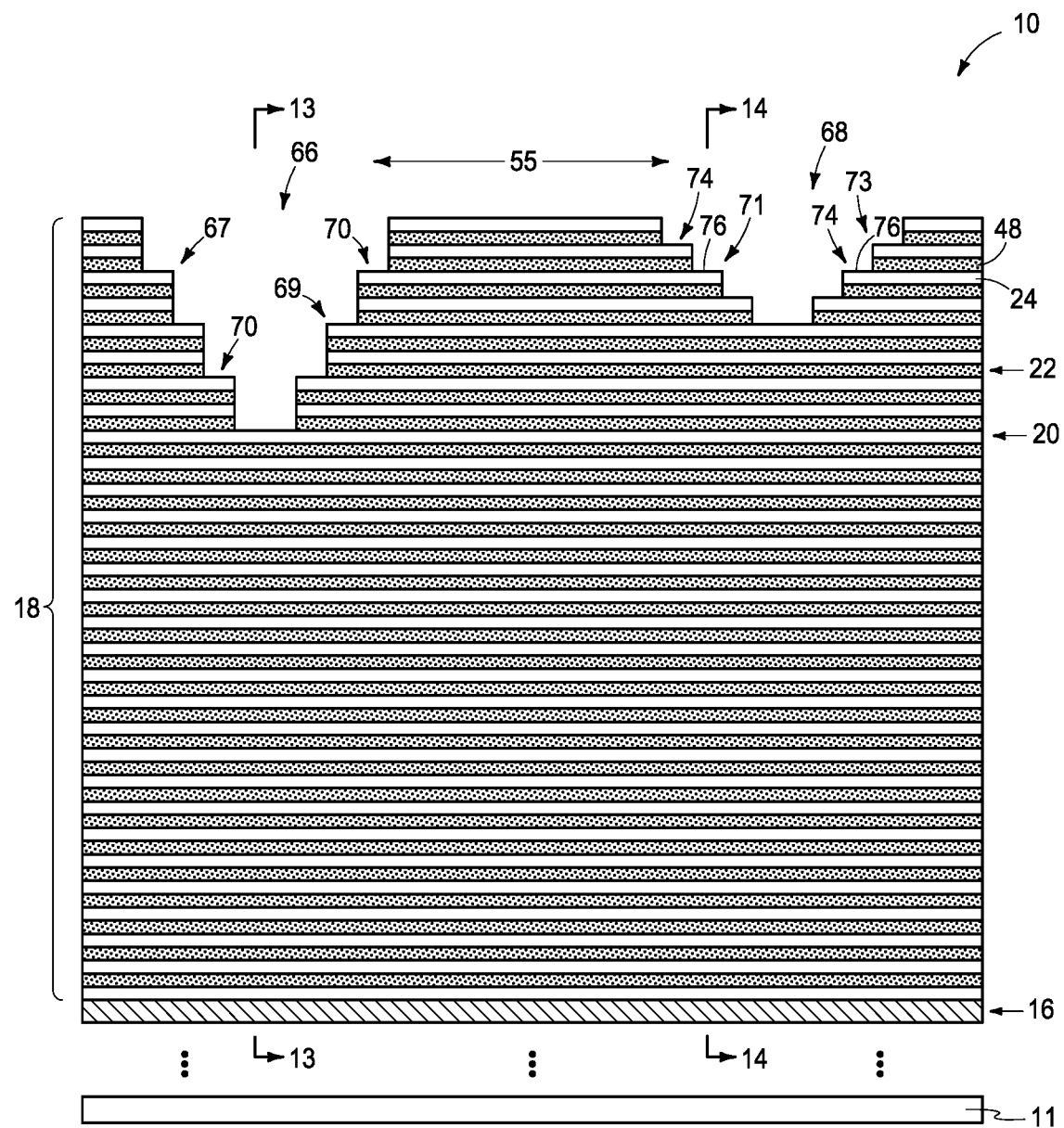
FIG. 12 is a diagrammatic view of a portion of memory circuitry in process in accordance with an embodiment of the invention.
Figure 13:
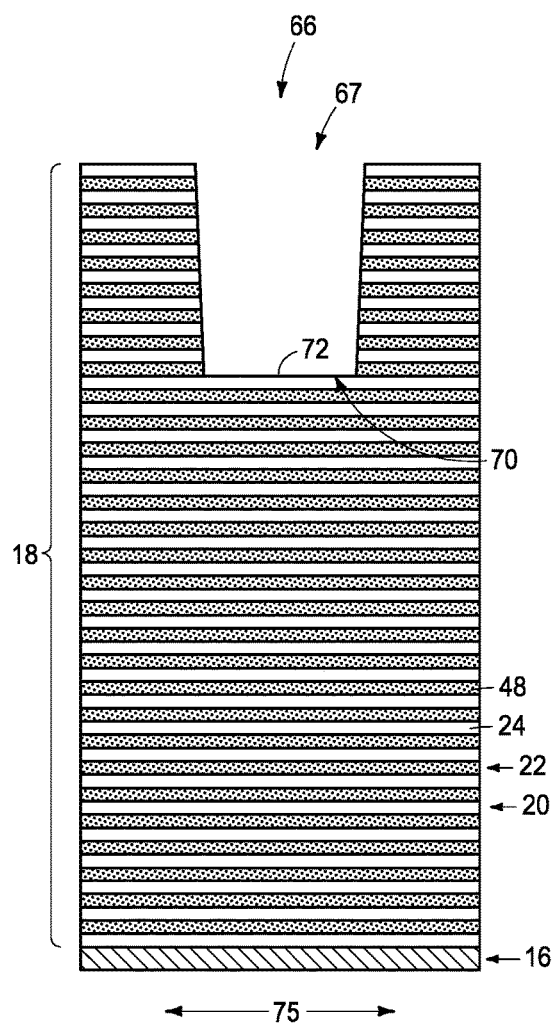
FIG. 13 is a cross-sectional view of FIG. 12.
Figure 14:
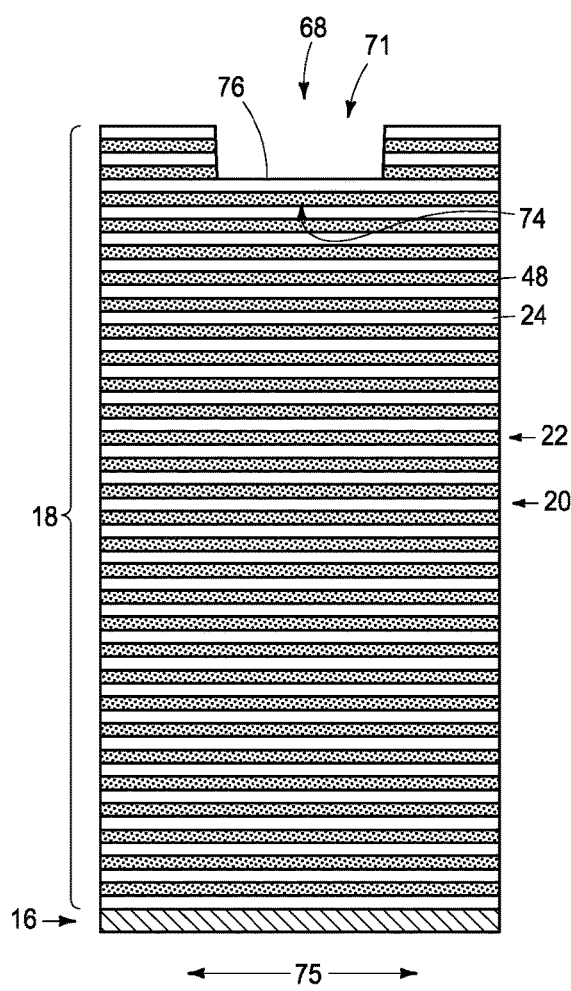
FIG. 14 is a cross-sectional view of FIG. 12.

Embodiments of the invention include methods of forming integrated circuitry, for example as is next described with respect to FIGS. 12-21. Referring first to FIGS. 12-14, such shows an example predecessor construction to that shown by FIGS. 7, 8, and 9, respectively. A stair-step region 13 is between two 3D-array regions 12 (e.g., as regions 12 are shown in FIG. 1). Two 3D-array regions 12 and stair-step region 13 there-between collectively comprise a vertical stack 18 comprising alternating first tiers 22 and second tiers 20 of different composition relative one another. Method embodiments of the invention encompass so-called "gate-last" or "replacement-gate" processing, so-called "gate-first" processing, and other processing independent of when transistor gates are formed. First tiers 22 may not comprise conducting material and second tiers 20 may not comprise insulative material or be insulative at this point in processing in conjunction with example hereby-described and shown "gate-last" or "replacement-gate" processing. Accordingly, material 48 (e.g., silicon nitride) would be sacrificial and is shown with stippling in FIGS. 12-21. Such would later be replaced with permanent conducting material 48.

First stair-step structures 66 have been formed that alternate with second stair-step structures 68 along a first direction 55 within stair-step region 13. First stair-step structures 66 have been formed to comprise two opposing first flights 67, 69 of stairs 70 in a first vertical cross-section (e.g., that of FIG. 12) along first direction 55. Stairs 70 in first flights 67, 69 will each ultimately have multiple different-depth treads (e.g., 72, and multiple treads not-yet-shown) in a second vertical cross-section that is along a second direction that is orthogonal to first direction 55. Second stair-step structures 68 have been formed to comprise two opposing second flights 71, 73 of stairs 74 in the first vertical cross-section, with stairs 74 in second flights 71, 73 ultimately having only a single one tread (e.g., 76) along the second direction.

An example method of forming a stair-step structure forms a masking material (e.g., a photo-imageable material such as photoresist and not shown) atop stack 18 having an opening formed there-through centrally relative to the stair-step structure being formed. Then, the masking material may be used as a mask while etching (e.g., anisotropically) through the opening to extend such opening into at least two outermost two tiers 20, 22. The resultant construction may then be subjected to a successive alternating series of lateral-trimming etches of the masking material followed by etching deeper into stack 18, at least two-tiers 20, 22 at a time, using the trimmed masking material having a successively widened opening as a mask.

Regardless, in accordance with a method embodiment of the invention and as shown, the forming of first stair-step structures 66 comprises a first etching process comprising etching two and only two of first tiers 22 and etching two and only two of second tiers 20 in at least initially forming individual of stairs 70 of first flights 67, 69 of stairs 70 in the first vertical cross-section. The forming of second stair-step structures 68 comprises a second etching process comprising etching one and only one of first tiers 22 and etching one and only one of second tiers 20 in at least initially forming individual stairs 74 of second flights 71, 73 of stairs 74 in the first vertical cross-section. FIGS. 12-14 show an example result from such first and second etching processes with respect to two stair-step structures 66 and 68 being formed. The first and second etching processes may be conducted in any order relative one another. Locations where first stair-step structures 66 are or will be may be masked (e.g., with photoresist) while conducting the second etching process and locations where second stair-step structures 68 are or will be may be masked (e.g., with photoresist) while conducting the first etching process.

Figure 15:
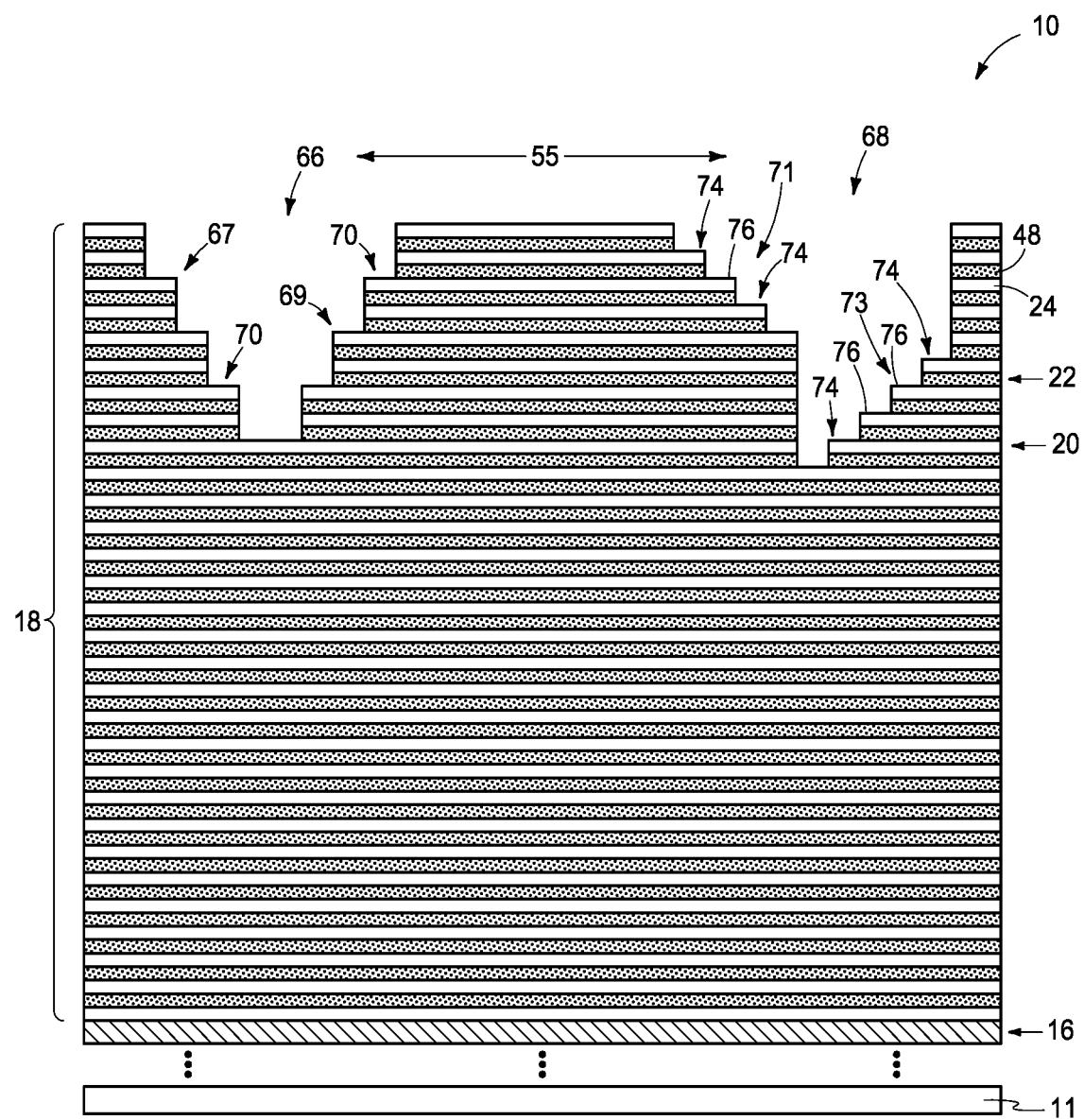
FIG. 15 is a diagrammatic view of a portion of memory circuitry in process in accordance with an embodiment of the invention.

Referring to FIG. 15, second flight 73 in second stair-step structure 68 has been translated downwardly into stack 18 relative to second flight 71 (e.g., by etching and while second flight 71 in second stair-step structure 68 is masked and while all of first stair-step structure 66 is masked).

Figure 16:
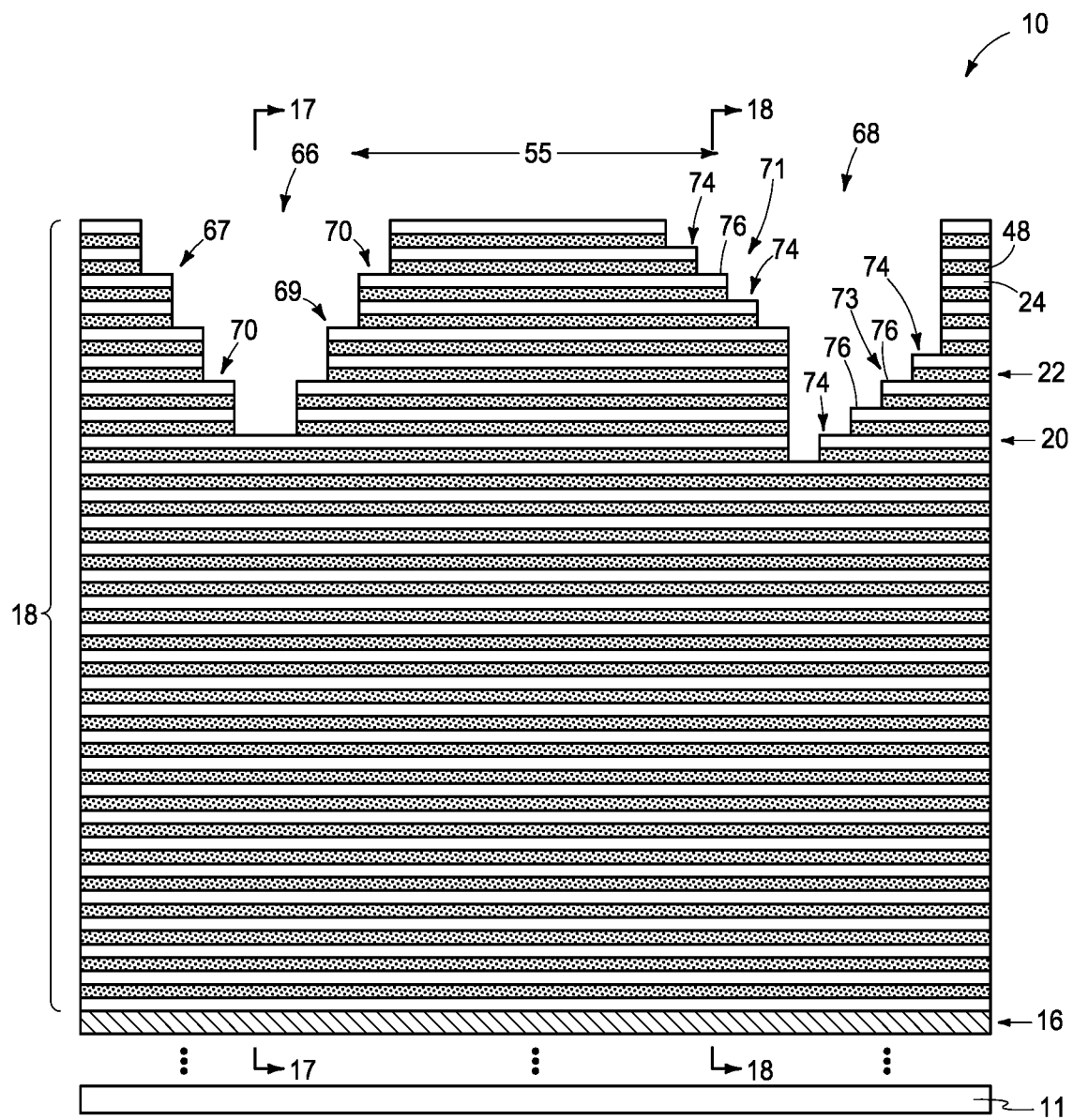
FIG. 16 is a diagrammatic view of a portion of memory circuitry in process in accordance with an embodiment of the invention.
Figure 17:
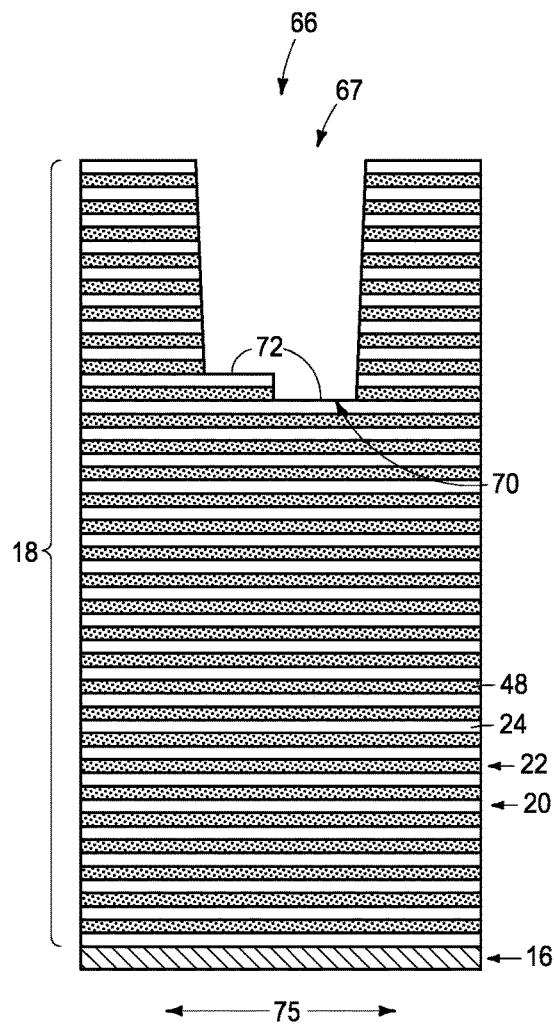
FIG. 17 is a cross-sectional view of FIG. 16.
Figure 18:
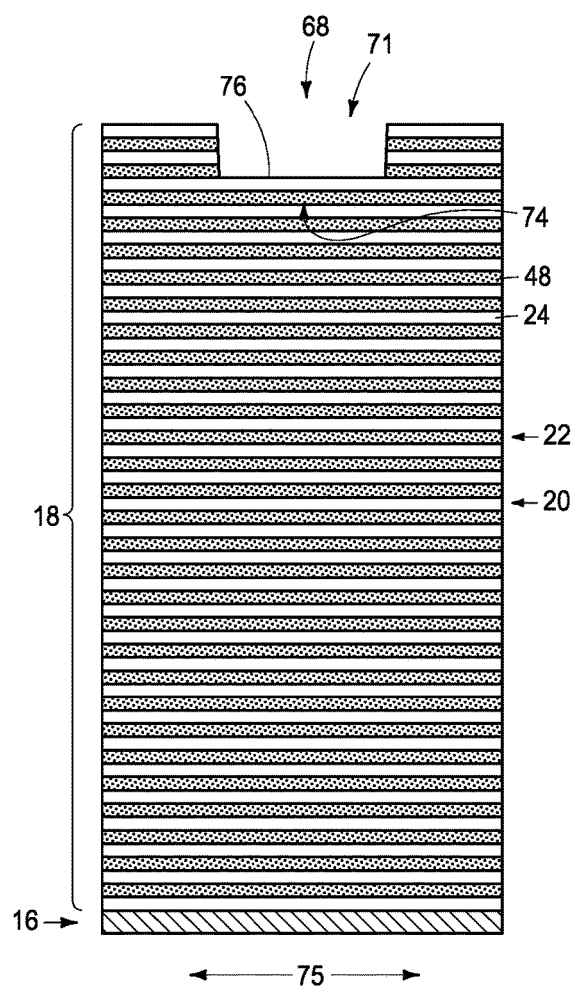
FIG. 18 is a cross-sectional view of FIG. 16.

Referring to FIGS. 16-18, and after the first etching process described above and shown with respect to FIGS. 12-14, stairs 70 of first flights 67, 69 of stairs 70 have been etched to form at least one of different-depth treads 72 (e.g., whereby multiple different-depth treads 72 have effectively been formed; e.g., while all of second stair-step structure 68 is masked and while only one lateral half of first stair-step structure 66 is masked).

Figure 19:
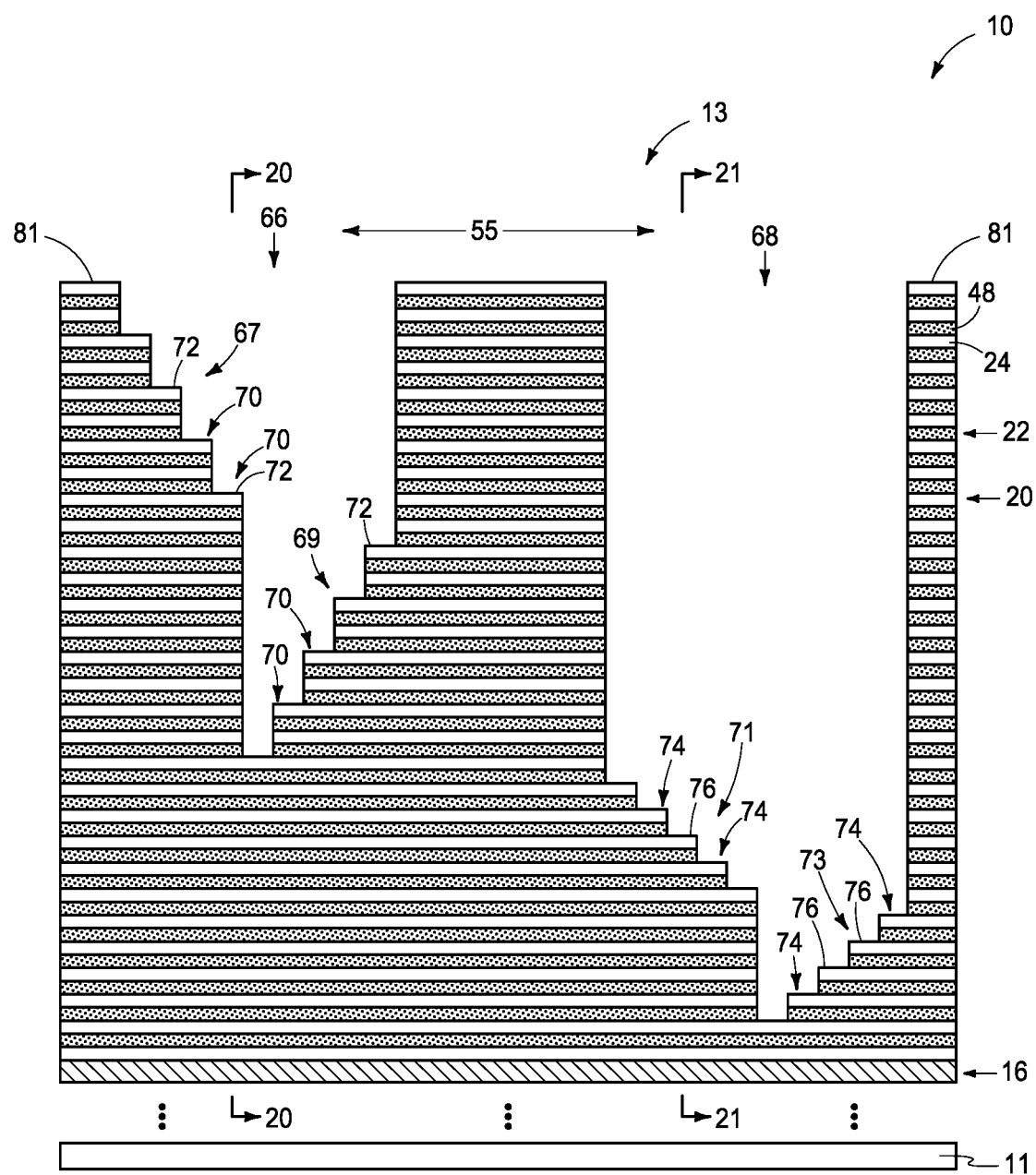
FIG. 19 is a diagrammatic view of a portion of memory circuitry in process in accordance with an embodiment of the invention.
Figure 20:
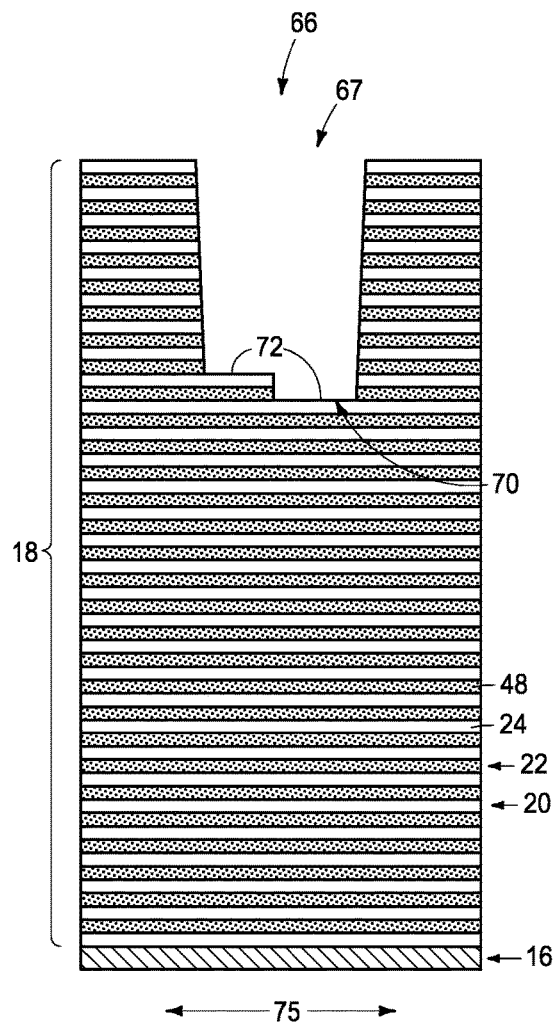
FIG. 20 is a cross-sectional view of FIG. 19.
Figure 21:
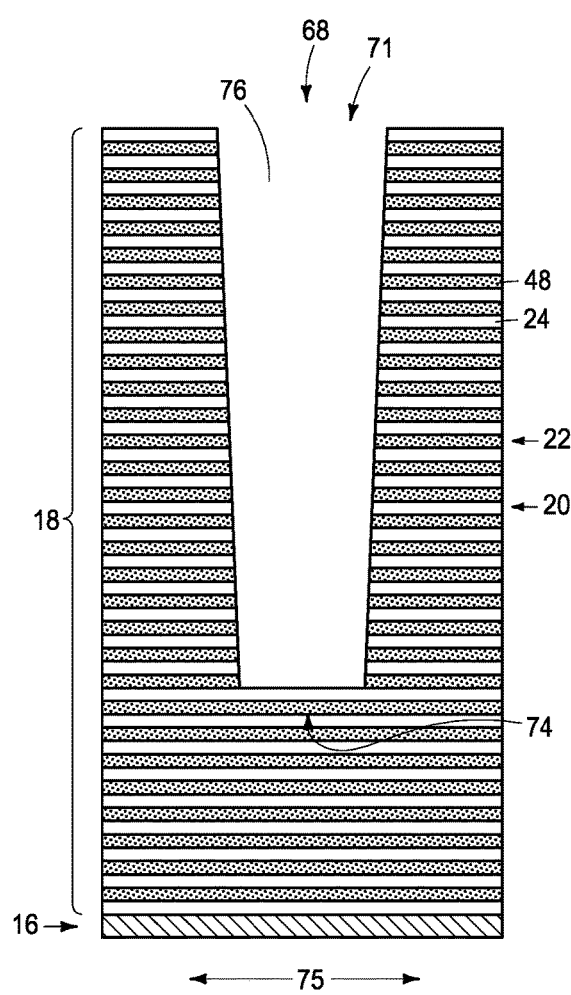
FIG. 21 is a cross-sectional view of FIG. 19.

FIGS. 19-21 show results of subsequent processing largely analogous to that shown and described above, specifically the translating of first flight 69 downwardly into stack 18 and the translating of second stair-step structure 68 downwardly into stack 18. Subsequent processing may occur whereby material 82 is formed, conductive vias 80 are formed there-through, sacrificial material 48 is removed and conducting material 48 substituted therefor, and walls 57 are formed.

In one embodiment, the etching of stairs 70 of first flights 67, 69 occurs after the second etching. In one embodiment, the integrated circuitry comprises memory, the two 3D-array regions comprise two memory-array regions and the electronic components comprise memory cells.

The artisan will recognize that processing largely as described above may be conducted with respect to multiple if not all first stair-step structures 66 using some common masks and over some common time periods. As well, processing largely as described above may be conducted with respect to multiple if not all second stair-step structures 68 using some common masks and over some common time periods different from those used in forming first stair-step structures 66.

Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials and/or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, integrated circuitry comprises two three-dimensional (3D) array regions individually comprising tiers of electronic components. A stair-step region is between the two 3D-array regions. First stair-step structures alternate with second stair-step structures along a first direction within the stair-step region. The first stair-step structures individually comprise two opposing first flights of stairs in a first vertical cross-section along the first direction. The stairs in the first flights each have multiple different-depth treads in a second vertical cross-section that is along a second direction that is orthogonal to the first direction. The second stair-step structures individually comprise two opposing second flights of stairs in the first vertical cross-section. The stairs in the second flights each have only a single one tread along the second direction.

In some embodiments, memory circuitry comprising strings of memory cells comprises two memory-array regions having a stair-step region there-between. Memory blocks are in each of the two memory-array regions and individually comprise a vertical stack comprising alternating insulative tiers and conductive tiers. Channel-material strings of memory cells extend through the insulative tiers and the conductive tiers in the memory blocks in the two memory-array regions. Walls are individually between immediately-adjacent of the memory blocks. The walls extend in a first direction from one of the two memory-array regions into the other of the two memory-array regions across the stair-step region. The insulative tiers and the conductive tiers extend along the first direction from the two memory-array regions into the stair-step region. The conductive tiers individually comprise a conductive line that extends across the stair-step region along the first direction into and within individual of the memory blocks in each of the two memory-array regions. First stair-step structures alternate with second stair-step structures along the first direction within the stair-step region laterally between immediately-adjacent of the walls. The first stair-step structures individually comprise two opposing first flights of stairs in a first vertical cross-section along the first direction. The stairs of the first flights each have multiple different-depth treads in a second vertical cross-section that is along a second direction that is orthogonal to the first direction. The second stair-step structures individually comprise two opposing second flights of stairs in the first vertical cross-section. The stairs in the second flights each have only a single one tread along the second direction.

In some embodiments, a method of forming integrated circuitry comprises forming two three-dimensional (3D) array regions that will individually comprise tiers of electronic components in a finished-circuitry construction. A stair-step region is between the two 3D-array regions. The two 3D-array regions and the stair-step region there-between collectively comprise a vertical stack comprising alternating first tiers and second tiers of different composition relative one another. First stair-step structures are formed that alternate with second stair-step structures along a first direction within the stair-step region. The first stair-step structures are formed to comprise two opposing first flights of stairs in a first vertical cross-section along the first direction. The stairs in the first flights each have multiple different-depth treads in a second vertical cross-section that is along a second direction that is orthogonal to the first direction. The second stair-step structures are formed to comprise two opposing second flights of stairs in the first vertical cross-section. The stairs in the second flights each have only a single one tread along the second direction. The forming of the first stair-step structures comprises a first etching process. The first etching process comprises etching two and only two of the first tiers and etching two and only two of the second tiers in at least initially forming individual of the stairs of the first flights of stairs in the first vertical cross-section. The forming of the second stair-step structures comprises a second etching process. The second etching process comprises etching one and only one of the first tiers and etching one and only one of the second tiers in at least initially forming individual of the stairs of the second flights of stairs in the first vertical cross-section. After the first etching process, the stairs of the first flights of stairs are etched to form at least one of the different-depth treads.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising:
    two three-dimensional (3D) array regions individually comprising tiers of electronic components;
    a stair-step region between the two 3D-array regions;
    first stair-step structures that alternate with second stair-step structures along a first direction within the stair-step region;
    the first stair-step structures individually comprising two opposing first flights of stairs in a first vertical cross-section along the first direction, the stairs in the first flights each having multiple different-depth treads in a second vertical cross-section that is along a second direction that is orthogonal to the first direction; and
    the second stair-step structures individually comprising two opposing second flights of stairs in the first vertical cross-section, the stairs in the second flights each having only a single one tread along the second direction.

2. The integrated circuitry of claim 1 wherein the multiple different-depth treads in individual of the second vertical cross-sections in individual of the first stair-step structures are only two in number.

3. The integrated circuitry of claim 1 wherein the two opposing first flights of stairs in individual of the first stair-step structures extend along different non-overlapping depths relative one another and the two opposing second flights of stairs in individual of the second stair-step structures extend along different non-overlapping depths relative one another.

4. The integrated circuitry of claim 1 wherein all of the first stair-step structures extend along different non-overlapping depths relative one another and all of the second stair-step structures extend along different non-overlapping depths relative one another, at least a majority of all of the second stair-step structures being deeper than at least a majority of all of the first stair-step structures.

5. The integrated circuitry of claim 4 wherein a deepest of all of the first stair-step structures and a deepest of all of the second stair-step structures are closest to one of the two 3D-array regions.

6. The integrated circuitry of claim 4 wherein a deepest of all of the first stair-step structures and a deepest of all of the second stair-step structures are closest to a same one of the two 3D-array regions.

7. The integrated circuitry of claim 1 comprising first regions of driver circuitry directly under the first stair-step structures and second regions of driver circuitry directly under the second stair-step structures, the first regions individually being wider than individual of the second regions in the first vertical cross-section.

8. The integrated circuitry of claim 7 wherein the first regions and the second regions extend along a same depth relative one another.

9. The integrated circuitry of claim 7 wherein the first regions extend in the first direction to also be directly under immediately-adjacent of the second stair-step structures.

10. The integrated circuitry of claim 9 wherein the first regions and the second regions extend along a same depth relative one another.

11. The integrated circuitry of claim 1 comprising walls that extend in the first direction from one of the two 3D-array regions into the other of the two 3D-array regions across the stair-step region, the walls being spaced from one another in the second direction, the first stair-step structures and the second stair-step structures being between immediately-adjacent of the walls.

12. The integrated circuitry of claim 11 wherein each of the first stair-step structures and each of the second stair-step structures is everywhere laterally-spaced from its immediately-adjacent of the walls.

13. The integrated circuitry of claim 1 wherein the integrated circuitry comprises memory, the two 3D-array regions comprise two memory-array regions, and the electronic components comprise memory cells.

14. The integrated circuitry of claim 13 comprising NAND.

15. Memory circuitry comprising strings of memory cells, comprising:
- two memory-array regions having a stair-step region there-between;
- memory blocks in each of the two memory-array regions that individually comprise a vertical stack comprising alternating insulative tiers and conductive tiers, channel-material strings of memory cells extending through the insulative tiers and the conductive tiers in the memory blocks in the two memory-array regions;
- walls that are individually between immediately-adjacent of the memory blocks, the walls extending in a first direction from one of the two memory-array regions into the other of the two memory-array regions across the stair-step region;
- the insulative tiers and the conductive tiers extending along the first direction from the two memory-array regions into the stair-step region, the conductive tiers individually comprising a conductive line that extends across the stair-step region along the first direction into and within individual of the memory blocks in each of the two memory-array regions;
- first stair-step structures that alternate with second stair-step structures along the first direction within the stair-step region laterally between immediately-adjacent of the walls;
- the first stair-step structures individually comprising two opposing first flights of stairs in a first vertical cross-section along the first direction, the stairs of the first flights each having multiple different-depth treads in a second vertical cross-section that is along a second direction that is orthogonal to the first direction; and
- the second stair-step structures individually comprising two opposing second flights of stairs in the first vertical cross-section, the stairs in the second flights each having only a single one tread along the second direction.

16. The memory circuitry of claim 15 comprising NAND.

17. The memory circuitry of claim 15 wherein the multiple different-depth treads in individual of the second vertical cross-sections in individual of the first stair-step structures are only two in number.

18. The memory circuitry of claim 15 wherein the two opposing first flights of stairs in individual of the first stair-step structures extend along different non-overlapping depths relative one another and the two opposing second flights of stairs in individual of the second stair-step structures extend along different non-overlapping depths relative one another.

19. The memory circuitry of claim 15 wherein all of the first stair-step structures extend along different non-overlapping depths relative one another and all of the second stair-step structures extend along different non-overlapping depths relative one another, at least a majority of all of the second stair-step structures being deeper than at least a majority of all of the first stair-step structures.

20. The memory circuitry of claim 19 wherein a deepest of all of the first stair-step structures and a deepest of all of the second stair-step structures are closest to one of the two memory-array regions.

21. The memory circuitry of claim 19 wherein a deepest of all of the first stair-step structures and a deepest of all of the second stair-step structures is closest to a same one of the two memory-array regions.

22. The memory circuitry of claim 19 comprising at least one select gate drain stair-step structure in the stair-step region, all of the second stair-step structures being deeper than all of the first stair-step structures below the at least one select gate drain stair-step structure.

23. The memory circuitry of claim 15 comprising first regions of driver circuitry directly under the first stair-step structures and second regions of driver circuitry directly under the second stair-step structures, the first regions individually being wider than individual of the second regions in the first vertical cross-section.

24. The memory circuitry of claim 23 wherein the first regions and the second regions extend along a same depth relative one another.

25. The memory circuitry of claim 23 wherein the first regions extend in the first direction to also be directly under immediately-adjacent of the second stair-step structures.

26. The memory circuitry of claim 25 wherein the first regions and the second regions extend along a same depth relative one another.

27. The memory circuitry of claim 15 wherein each of the first stair-step structures and each of the second stair-step structures is everywhere laterally-spaced from its immediately-adjacent of the walls.

28. A method of forming integrated circuitry comprising:
- forming two three-dimensional (3D) array regions that will individually comprise tiers of electronic components in a finished-circuitry construction, a stair-step region being between the two 3D-array regions, the two 3D-array regions and the stair-step region there-between collectively comprising a vertical stack comprising alternating first tiers and second tiers of different composition relative one another;
- forming first stair-step structures that alternate with second stair-step structures along a first direction within the stair-step region;
- the first stair-step structures being formed to comprise two opposing first flights of stairs in a first vertical cross-section along the first direction, the stairs in the first flights each having multiple different-depth treads in a second vertical cross-section that is along a second direction that is orthogonal to the first direction;
- the second stair-step structures being formed to comprise two opposing second flights of stairs in the first vertical cross-section, the stairs in the second flights each having only a single one tread along the second direction;
- the forming of the first stair-step structures comprising a first etching process, the first etching process comprising etching two and only two of the first tiers and etching two and only two of the second tiers in at least initially forming individual of the stairs of the first flights of stairs in the first vertical cross-section;
- the forming of the second stair-step structures comprising a second etching process, the second etching process comprising etching one and only one of the first tiers and etching one and only one of the second tiers in at least initially forming individual of the stairs of the second flights of stairs in the first vertical cross-section; and
- after the first etching process, etching the stairs of the first flights of stairs to form at least one of the different-depth treads.

29. The method of claim 28 wherein the etching the stairs of the first flights of stairs occurs after the second etching.

30. The method of claim 28 wherein the integrated circuitry comprises memory, the two 3D-array regions comprise two memory-array regions, and the electronic components comprise memory cells.

31. The method of claim 30 comprising NAND.

* * * * *